(12) United States Patent
Kalte et al.

(10) Patent No.: US 12,158,849 B2
(45) Date of Patent: Dec. 3, 2024

(54) METHOD FOR DATA COMMUNICATION BETWEEN SUBREGIONS OF AN FPGA

(71) Applicant: dSPACE GmbH, Paderborn (DE)

(72) Inventors: Heiko Kalte, Paderborn (DE); Dominik Lubeley, Paderborn (DE)

(73) Assignee: dSPACE GMBH, Paderborn (DE)

( * ) Notice: Subject to any disclaimer, the term of this patent is extended or adjusted under 35 U.S.C. 154(b) by 9 days.

(21) Appl. No.: 18/082,288

(22) Filed: Dec. 15, 2022

(65) Prior Publication Data

US 2023/0195661 A1 Jun. 22, 2023

(30) Foreign Application Priority Data

Dec. 17, 2021 (DE) .................... 10 2021 133 735.6
Dec. 17, 2021 (EP) ..................... 21215621

(51) Int. Cl.
*G06F 13/16* (2006.01)
*G11C 7/10* (2006.01)
*H03K 19/1776* (2020.01)

(52) U.S. Cl.
CPC ............ *G06F 13/1668* (2013.01); *G11C 7/10* (2013.01)

(58) Field of Classification Search
CPC ................................ H04L 12/66; H04L 45/60
See application file for complete search history.

(56) References Cited

U.S. PATENT DOCUMENTS

| | | | |
|---|---|---|---|
| 6,496,971 B1 | 12/2002 | Lesea et al. | |
| 6,662,285 B1 | 12/2003 | Douglass et al. | |
| 7,818,699 B1 * | 10/2010 | Stuber | G06F 30/34 |
| | | | 716/128 |
| 2004/0113655 A1 | 6/2004 | Curd et al. | |
| 2007/0283181 A1 * | 12/2007 | Shelton | H04L 12/66 |
| | | | 713/400 |
| 2008/0175262 A1 * | 7/2008 | Kawano | H04L 45/60 |
| | | | 370/428 |
| 2013/0314559 A1 * | 11/2013 | Kim | H04N 23/66 |
| | | | 348/211.99 |
| 2015/0109024 A1 * | 4/2015 | Abdelfattah | H03K 19/017581 |
| | | | 326/41 |
| 2015/0364182 A1 * | 12/2015 | Tewalt | G06F 3/0688 |
| | | | 365/189.011 |
| 2019/0243796 A1 * | 8/2019 | Ping | G06F 13/4022 |

FOREIGN PATENT DOCUMENTS

| | | |
|---|---|---|
| WO | WO0159629 A1 | 8/2001 |
| WO | WO02056180 A2 | 7/2002 |
| WO | WO02056180 A3 | 7/2002 |
| WO | WO2006026799 A2 | 3/2006 |
| WO | WO2006026799 A3 | 3/2006 |

* cited by examiner

*Primary Examiner* — Getente A Yimer

(74) *Attorney, Agent, or Firm* — Muncy, Geissler, Olds & Lowe, P.C.

(57) ABSTRACT

A method is provided for data communication between at least one subregion of an FPGA and another region, in which the data communication is resource efficient. This is achieved by the fact that the data communication, i.e., the reading and writing of a Block RAM from a location to any Block RAM or from any Block RAM to any Block RAM of the FPGA takes place via command sequences of an internal configuration interface of the FPGA.

14 Claims, 3 Drawing Sheets

METHOD FOR DATA COMMUNICATION BETWEEN SUBREGIONS OF AN FPGA

This nonprovisional application claims priority under 35 U.S.C. § 119 (a) to German Patent Application No. 10 2021 133 735.6, which was filed in Germany on Dec. 17, 2021, and to European Patent Application No. 21215621.0, which was filed in Europe on Dec. 17, 2021, and which are both herein incorporated by reference.

BACKGROUND OF THE INVENTION

Field of the Invention

The present invention relates to a method for data communication between at least one subregion of an FPGA and another region. The invention also relates to a data processing device and a computer program product.

Description of the Background Art

Rapid control prototyping systems or hardware-in-the-loop simulators are increasingly being used to control or simulate dynamic systems. These systems have one or more programmable logic devices known as Field Programmable Gate Arrays (FPGA), in addition to generally existing microprocessors. In its functional level, an FPGA comprises a plurality of logic elements and ports and/or connectors, the exact interconnection of which is determined only during initialization by means of a bit stream written to the configuration level of the device. The architecture of FPGAs thus allows for good adaptation to the respective application and parallel processing of signals, so that FPGAs can reliably simulate or control even rapidly changing paths.

FPGA design modeling is similar to processor-based modeling in Simulink. From processor-based modeling, the user is used to the fact that a processor model can be compiled in a few seconds to minutes and executed on the real-time hardware. What can be simulated in Simulink is compilable for the processor. Limiting factors usually only become apparent at runtime, e.g., if there is too little allocable RAM or the computing power of the processor is too low. Since the size of the RAM is known, this error could be considered a design flaw in the model. The task period can be increased against the insufficient computing time. In any case, however, a correctly designed model is compilable and executable.

This is exactly what is fundamentally different in FPGA-based modeling and can lead to high development costs. The compilation, synthesis and implementation of an FPGA model is not a process of seconds to minutes, but of 10 minutes to several hours. What can be simulated in Simulink does not have to be implementable. Limiting factors here are also countable logic elements such as flip-flops, lookup tables, Block RAMS, DSPs or artificial intelligence cores. However, the relationship between FPGA model and required resources is only known after the synthesis, which requires about ⅓ of the FPGA build time. Since the resources of the FPGA are known, exceeding these resources could also be seen as a design flaw in the model. If the modeler reduces the resource requirements of his model accordingly, he might think that everything is fine. However, this assumption is wrong. In contrast to the fixed processor architecture, which can execute arbitrary model code, the FPGA model is translated into its own logic architecture during implementation. Model functionalities are mapped to individual logic elements, and these are connected to each other. It is then decided where exactly which logic element will be placed in the FPGA and which existing wiring elements can be used for routing between the logic elements.

If the routing of FPGA components can only be realized in a roundabout way, i.e., at extra-long distances because shorter routing paths are blocked by the routing of other components, the timing requirements (e.g., 8 ns at 125 MHz clock) cannot be met and the design is not feasible in this FPGA. If not enough routing resources are available, not all placeable FPGA components can be connected to each other. In this case, also, the design is not feasible in this FPGA. The user may only receive feedback after hours of FPGA synthesis and implementation that not all connections could be routed, or that the timing is too slow for the specified FPGA clock.

So far, an FPGA modeler tries to solve the problems described above as follows. A timing error can be counteracted by inserting additional registers into signal paths, reducing the FPGA clock, or performing n-fold downsampling of the logic circuit, so that a signal has n× e.g., 8 ns time available for a route instead of only e.g., 8 ns time. If work is to be performed synchronously with other pre-defined clocks, the reduction of the clock is usually not possible, or additional latency-laden FIFOs would be required to decouple the clock domains. When downsampling certain FPGA model paths, the path lengths, measured in clocks, of all parallel paths would have to be adjusted.

For insufficient routing resources, there is no solution except to modify or shrink the structure of the model, even though the FPGA has enough logic resources. In order to stop combating symptoms of scarce routing resources, it is necessary to ask why routing resources are scarce and in which cases this can be avoided. A large part of the routing wiring is attributable to the Block RAMS. For all Block RAMs that are dated at the init phase or at runtime, the full address and data bus must be routed to one or more memory controllers. Since the Block RAMs are distributed over the entire area of the FPGA, significant amounts of the FPGA's routing resources are lost.

SUMMARY OF THE INVENTION

It is therefore an object of the present invention to provide resource-efficient intra-FPGA data communication, wherein the data communication between subregions of an FPGA takes place in a resource-efficient manner.

According to an exemplary embodiment, the object of the invention is achieved by a method for data communication between at least one subregion of an FPGA and a further region, the method comprising the following steps: providing an FPGA unit with an FPGA, the FPGA comprising a communication controller with a cache of the communication controller comprising an internal configuration interface set up for configuring the FPGA and for reading back configuration data, wherein the communication controller is configured to provide data communication between subregions of the FPGA, wherein the control of the internal configuration interface is carried out via command sequences, the FPGA comprises at least one first subregion, wherein the first subregion is a Block RAM, wherein the Block RAM is addressable via a Block RAM frame, the Block RAM frame comprises fixed configuration bits and variable data bits, wherein Block RAM frame contents are readable and writable via the command sequences of the internal configuration interface, wherein the relative positions and fixed values of the configuration bits and the relative positions and the variable data bits in the Block RAM frame are determined from a reconstruction of a logic location file, wherein a write of the Block RAM is carried out by means of a read-modify-write sequence and includes the following steps: reading of the current content of a Block RAM frame and storing the contents of the Block RAM frame in the cache of the communication controller by means of a read sequence, and inserting data bits at their fixed positions known from the logic location file into the Block RAM frame by means of a write sequence or writing the Block RAM by means of a template, wherein the template contains the relative positions and fixed values of the configuration bits determined from the reconstruction of the logic location file and the relative positions of the variable data bits in the Block RAM frame, wherein the template was previously stored in the communication controller.

The data bits can each be sent from another freely configurable subregion of the FPGA to the communication controller or sent from a region outside the FPGA to the communication controller.

The basic idea of the present invention is to use the FPGA configuration level, which is originally used for programming the FPGA and provides an unused communication infrastructure at runtime, for data exchange between subregions of an FPGA. A data transfer between subregions of the FPGA is set up by means of command sequences by means of a communication controller. The communication controller controls the unused communication infrastructure of the configuration level via the FPGA internal configuration interface, e.g., the ICAP interface for Xilinx FPGAs. The data communication can take place between freely configurable subregions of the FPGA or between a freely configurable subregion of the FPGA and a region outside the FPGA. The possibility is thus created to provide a data exchange from one location to any Block RAM or from any Block RAM to any other arbitrary Block RAM, in which the normally necessary routing resources are reduced.

A reading of the Block RAMs can be carried out by means of a Block RAM read sequence, wherein the reading of the Block RAMs comprises the following step: extracting data bits from the Block RAM frame via their positions known from the logic location file using the communication controller, wherein the extraction of the data bits is done by means of command sequences of the internal configuration interface.

Various templates for different Block RAM types can be stored in the communication controller.

The relative positions and fixed values of the configuration bits as well as the relative positions of the variable data bits can be stored in the template in a VHDL code for an FPGA build.

The read-modify-write sequence reads the current frame contents into a cache from the communication controller, and the data bits are inserted into the receive Block RAM at their fixed positions known from the logic location file during writing. This halves the write performance. To circumvent this, in an example, the communication controller VHDL can provide templates with a one-time determined bitstream sequence for different receive Block RAM types.

The FPGA can comprise a transmit Block RAM and a receive Block RAM, and the method can include the additional steps of: writing data to the transmit Block RAM by means of the method step for writing Block RAM, triggering the communication controller to copy the data from the transmit Block RAM to the receive Block RAM, and/or copying the data from the transmit Block RAM to the receive Block RAM, by means of the method step of reading the Block RAM and the method step of writing the Block RAM.

The method step of writing data to the transmit Block RAM could take place by the model itself, which wants to send data somewhere. In a further example of the method, the method step could also be triggered during the init phase by an initialization mechanism in the FPGA, which receives data from the processor and wants to copy it to certain Block RAMs in the FPGA.

The transfer can be made by the model as well as any other controller (e.g., for initialization).

The communication controller may take control of an address port of the transmit Block RAM to be read by means of the internal configuration interface, wherein data is simultaneously written from a subregion of the FPGA to an address created by the configuration level of the internal configuration interface into the transmit Block RAM, then read from the configuration level of the internal configuration interface, cached in the communication controller, written by the communication controller to the receive Block RAM by writing data, wherein the data is simultaneously read from a subregion of the FPGA from the address of the receiving Block RAM created by the configuration layer of the internal configuration interface.

The communication controller thus can control the data transmission and uses the internal configuration interface.

The internal configuration interface may write independently of the subregion address line of the Block RAM to the frame bits of the Block RAM.

The data communication between subregions of the FPGA can take place via specially inserted Block RAMs as communication gateways.

The communication controller can be triggered via a single dedicated control line or by a regular polling of the Block RAM data by means of a transmission flag.

The method for synchronizing the Block RAM accesses can comprise a BUSY signal which dedicatedly signals each Block RAM whether the Block RAM is currently being updated via the internal configuration interface, wherein the BUSY signal is realized by a 1 bit BUSY-signal line drawn to each Block RAM, or a first Block RAM element and a last Block RAM element are used for the BUSY signal, wherein a first word in the first Block RAM element starts the BUSY signal and a last word used in the last Block RAM element terminates the BUSY signal, and is configured via the configuration level to a register by the communication controller, wherein for that purpose this register is placed in a CLB frame region that contains no active parts of the FPGA application, so that a read-modify-write sequence of this CLB frame does not falsify runtime values of the FPGA application.

A BUSY signal is advantageous so that the Block RAMs are not used during an update from the configuration level with inconsistent states.

A wait signal may also be provided to indicate that the model has not yet read out the receiving Block RAM, and therefore should wait for further transmission. The implementation can be done according to the BUSY signal. In addition, a back propagation to other transmitting elements can take place.

According to a further aspect, the object of the invention is achieved by a data processing device for carrying out the method.

According to a further aspect, the object of the invention is achieved by a computer program product, comprising commands which, when executing the program by a computer, cause the computer to carry out the method described above.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
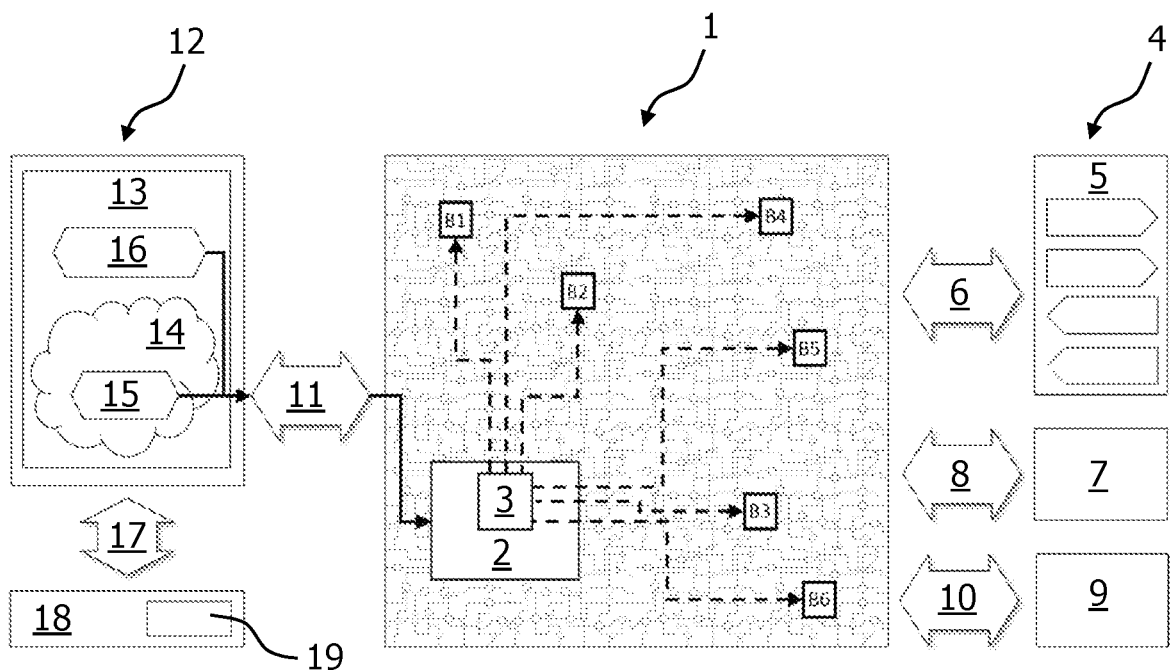
FIG. 1 is a block diagram of an FPGA unit with an FPGA, wherein a writing of a block RAM is shown according to an example of the invention.
Figure 2:
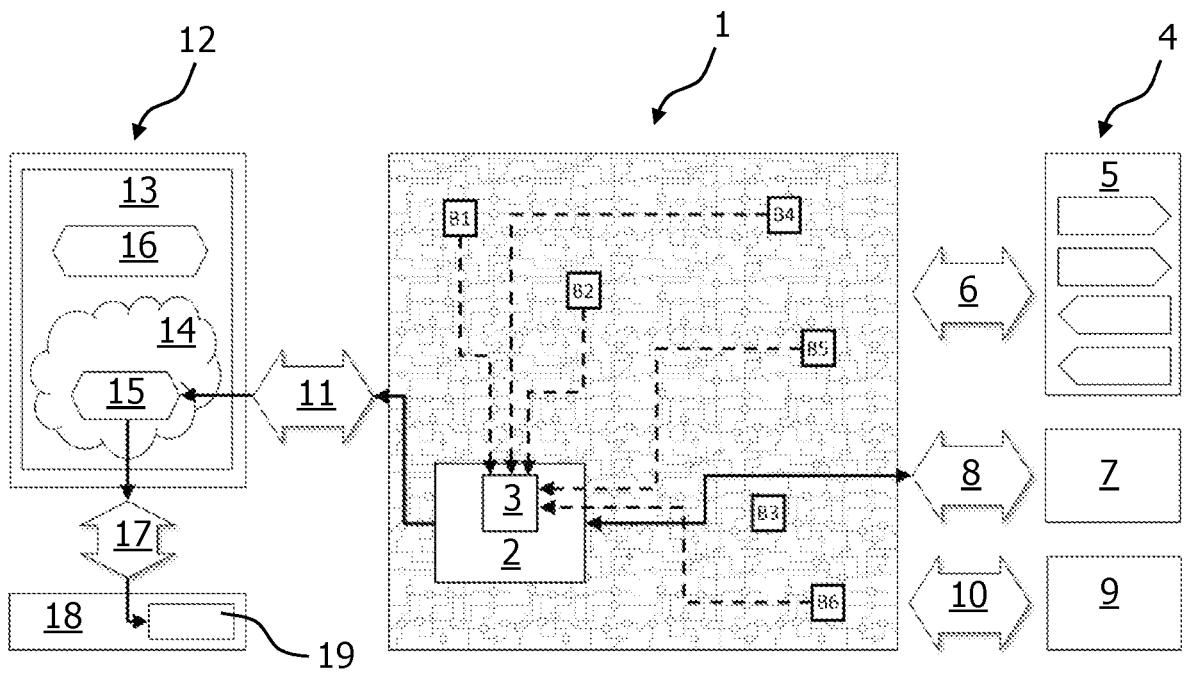
FIG. 2 is a block diagram of an FPGA unit with an FPGA, wherein a reading of a block RAM is shown according to an example of the invention.
Figure 3:
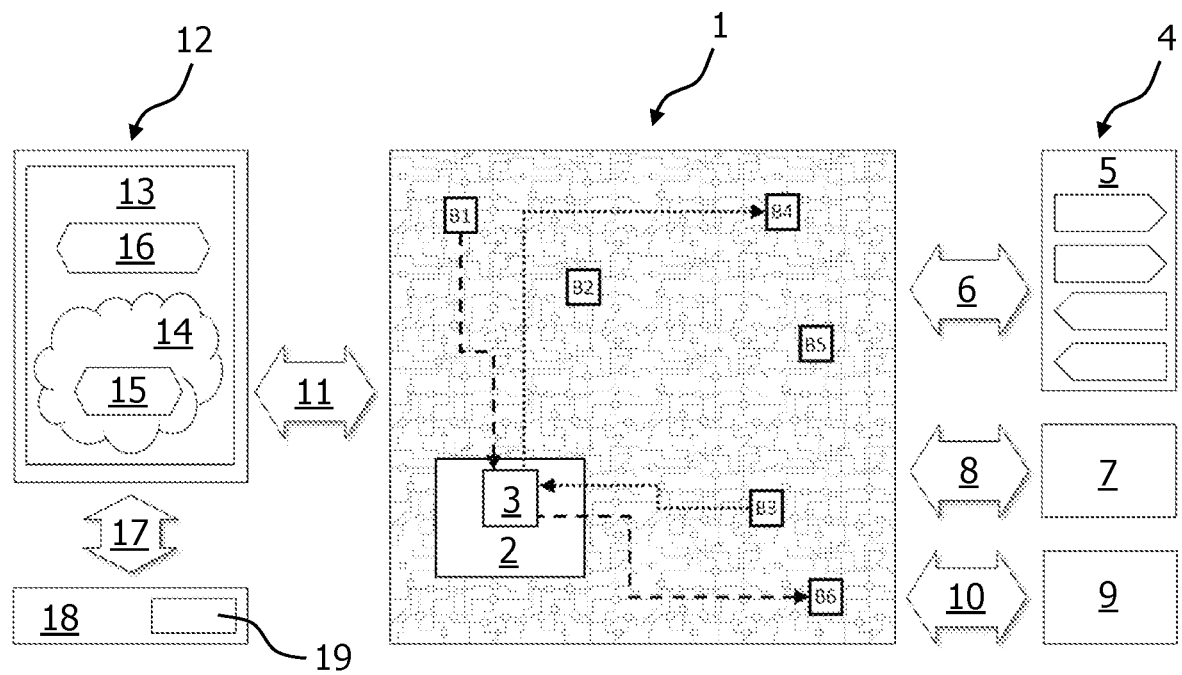
FIG. 3 is a block diagram of an FPGA unit with an FPGA, wherein a data communication between subregions of the FPGA via Block RAM is shown according to an example of the invention.
Figure 4:
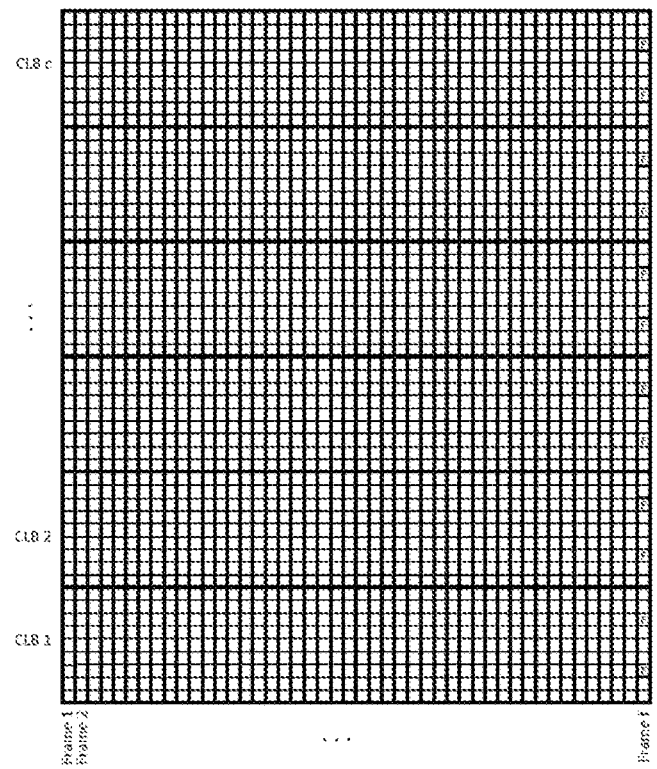
FIG. 4 is an example of a frame of a configurable logical block with flip-flop positions.

In the following, the basic features of the block diagrams shown in FIGS. 1 to 3 are first described. The block diagrams show an FPGA 1 that includes a freely configurable subregion. Several Block RAMs B1, B2, B3, B4, B5, B6 are implemented in the freely configurable subregions. The FPGA 1 can exchange data with external devices 4, e.g., the FPGA 1 can exchange data with an external input/output 5 via an input/output bus 6. For example, an LVDS FPGA I/O module interface may be provided as the transmission standard for data communication. Also, the FPGA can, for example, exchange data with an external RAM 7 via a RAM bus 8. Using a Multi Gigabit Transceiver (MGT) 10, data can also be transmitted from another FPGA 9 to the FPGA 1. Further, in FIGS. 1 to 3, a real-time CPU 12 with a real-time application 13 is shown which is used for transmitting initialization data 16 and for transmitting real-time data 15 via a CPU Model 14. The data is transmitted via a communication bus 11, for example, to the communication controller 2.

FIG. 1 shows a block diagram of an FPGA unit with an FPGA 1, wherein a writing of a Block RAM B1, B2, B3, B4, B5, B6 according to an example of the invention is shown. Thus, data from a source, which can also be located outside the FPGA 1, is transmitted to a Block RAM B1, B2, B3, B4, B5, B6 and written to the Block RAM B1, B2, B3, B4, B5, B6. FIG. 1 shows, for example, the initialization of the Block RAM B1, B2, B3, B4, B5, B6 by initial or model values 16 of a real-time application 13. Data is transmitted, e.g., from a real-time CPU 12 or via a communication network and/or a communication bus from another FPGA to the Block RAMs B1, B2, B3, B4, B5, B6 of the FPGA 1. As a further example, for example, Block RAM data can be transmitted from another FPGA 9 via Multi Gigabit Transceiver (MGT) to the Block RAMs B1, B2, B3, B4, B5, B6 of the FPGA. It is also possible to transmit data from an external RAM 7, which is usually 100× larger, to the Block RAMs B1, B2, B3, B4, B5, B6 of the FPGA 1 using a RAM bus 8.

In a further example of the invention, a Block RAM reading is provided. This is shown, for example, in FIG. 2. Data is transmitted from a Block RAM B1, B2, B4, B5, B6 to a target, e.g., an external DRAM 7. For example, the memory depth of an FPGA 1 internal logic analyzer can be extended by copying from the limited Block RAM B1, B2, B3, B4, B5, B6 to the 100× larger external RAM 7. Subsequently, logic analyzer values from the external RAM 7 can be read out by the host tool via the one data acquisition interface of the real-time application 13 via the FPGA 1. In an example, data from the FPGA Block RAM B1, B2, B3, B4, B5, B6 can be transmitted via a communication network and/or a communication bus to an SSD in a real-time CPU 12.

FIG. 3 shows the transmission of data from a Block RAM B1, B3 to another Block RAM B4, B6. As a result, for example, the following use cases can be realized. In an example, data communication between configurable subregions of the FPGA 1 can be established via specially inserted Block RAM gateways B1, B2, B3, B4, B5, B6 and a copy action between these Block RAM gateways. It is thus possible to copy Block RAM contents between two subregions comprising both Block RAMs. This example enables communication of possibly several subregions which are far apart in the FPGA 1 without costly bus wiring to all communication partners. For this purpose, each communication partner requires an additional Block RAM B1, B2, B3, B4, B5, B6, which acts as a pure communication gateway. For communication, data is written from a subregion to its transmit Block RAM B1, B3 and copied from the communication controller 2 to the receive Block RAM B4, B6 of another subregion in order to be read out there again. By the serial reading, caching in the communication controller 2 and subsequent writing to the target memory, the net data rate is normally quartered. So that it is not quartered, one of the following measures can be taken if necessary to achieve a pipelined data transfer. Depending on the technological characteristics of the FPGA 1, various examples may be provided. The internal configuration interface 3 can take control of an address port of the transmit Block RAM B1, B3 to be read. Data can be simultaneously written from the model to the address created by the configuration level to the send Block RAM B1, B3 and then read from the configuration level if the transmit Block RAM B1, B3 has been configured in write mode "read to write". This means that it could be written from a location in the 32-bit model to the transmit Block RAM B1, B3, while the data is transmitted synchronously in the configuration level to the communication controller. The data must be cached on the communication controller 2. However, only 1 cache is required for any start and target points, as the transmissions are serialized. The same technique is used for the receive Block RAM B4, B6. The receive Block RAM B4, B6 is also set to the write mode "read to write" and here also the configuration level takes over the address line. The data can then be read out synchronously to the arrival of the data in the receive Block RAM B4, B6. To synchronize the accesses, a synchronization line can be used in an example, which will be described in more detail later.

The internal configuration interface 3 writes independently of the model address line of the Block RAM B1, B2, B3, B4, B5, B6 to the frame bits of the Block RAM B1, B2, B3, B4, B5, B6. In this case, a second additional line in the model can be used to signal that the next data bit position in the frame has been written, and the user may increment the address on the address line in the model. A model part can now write data to the transmit Block RAM B1, B3 normally and then trigger the communication controller 2 via a single control line, or via a transmit flag into the Block RAM data, to copy this data to a receive Block RAM B4, B6. The address of the receive Block RAM B4, B6 can be set once at the FPGA build time or stored by the FPGA model in the Block RAM data at init phase/runtime. The communication controller 2 is triggered, either via the dedicated signal line or by regular polling of the Block RAM data, to the transmission flag to carry out the data transmission, if necessary by reading the receive address from the Block RAM data. Since transmit Block RAM B1, B3 and receive Block RAM B4, B6 are based on the same template, the complete Block RAM frames can be read and written without having to filter out the pure data. This saves reading access to the receive Block RAM B4, B6 when reading-modifying-writing.

Also, data from Block RAM contents can thus be copied between two subregions that use both Block RAMs. In the model, Block RAM memory is used by several subregions, which are to be copied. This case is a sub-case of the example described above, in which the insertion of the transmit Block RAMs B1, B3 and receive Block RAMs B4, B6 is omitted, since model Block RAMs are already present, between which pipelined data can be exchanged via the communication controller 2 analogously to the previously described example. For example, several Block RAMs B1, B2, B3, B4, B5, B6 can be kept synchronized via the communication controller using the method described above.

In the following, the reading or writing of Block RAMs B1, B2, B3, B4, B5, B6 is described. The internal configuration interface 3, for example integrated in Xilinx FPGAs, e.g., an ICAP interface, allows for reading and writing to elements in the FPGA configuration level. The elements are not accessible via direct address access but are organized in so-called frames with different frame types. CLB (Configurable Logic Block) elements, such as flip-flops, are accessed via CLB frames, each formed of the CLBs of an FPGA column. While a particular CLB frame is directly addressable, the elements within the CLB frame are accessed sequentially. All elements must always be read or written from the beginning of a frame to the relevant element in the frame.

Figure 5:
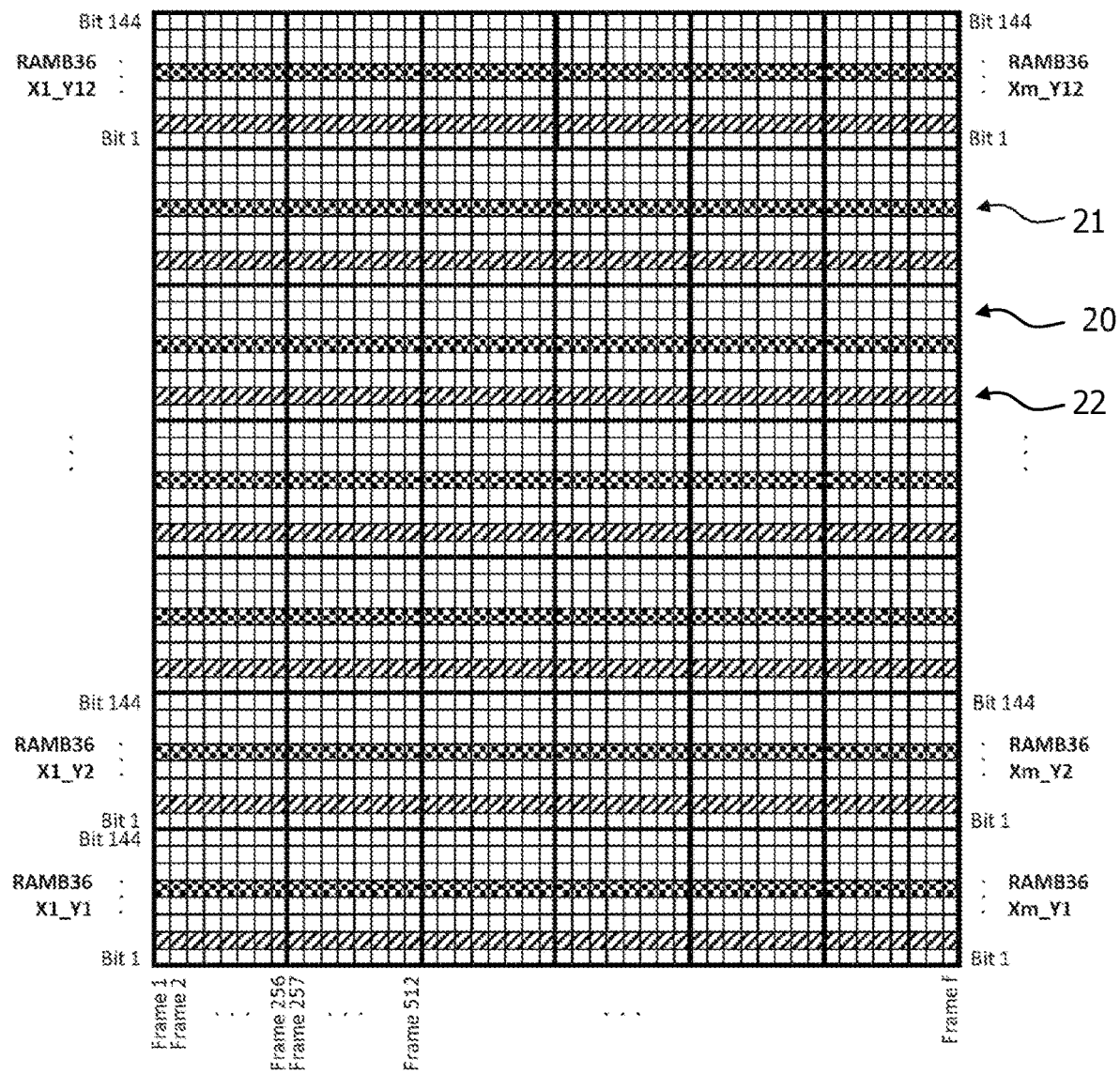
FIG. 5 is an example of a Block RAM frame.

Block RAMs B1, B2, B3, B4, B5, B6 are addressable via Block RAM frames. The undocumented organization of the Block RAM frames can be reconstructed from a logic location file for a created and implemented design. Each Block RAM element is divided into a certain number of data bits and parity bits. FIG. 5 shows a Block RAM Frame with RAMB36 positions of a Kintex UltraScale+ FPGA as an example. Due to the organization of the RAMB36 blocks in the BRAM frames shown in FIG. 5, for example, the Kintex UltraScale (+) contains 12 RAMB36 blocks proportionally in a BRAM frame. This means that for optimal read/write performance, if possible the 12 Block RAMs within a frame should be used, since a frame can only be read/written sequentially. The first RAMB36 in the frame is directly accessible and has the maximum performance. For the last RAMB36 in the frame, all other 11 must first be read. This means that the last RAMB36 can only achieve maximum performance if all related 12 RAMB36 of a frame are read. In the logic location file, the 144 bits (128 data+16 parity) are distributed over 240 offsets within a frame. The parity bits 21 are always at the same offsets, resulting in the lines for parity bits 21. Within the 144 bits there are 2×8 bits parity bits, indicated in the graph by only one instead of 8 lines per Block RAM, i.e., per one of the 6×6 sub-squares. The skipped offsets are always identical, thus resulting in the lines for configuration bits 22 in the graphic. In the graph indicated by one line, instead of at least 240−144=96 lines of Block RAM, i.e., per one of the 6×6 sub-squares. In principle, there are also RAM configurations without parity, since parity is only supported for a port width of 9, 18 and 36 bits. Since the exact structure depends on the family or model series of the FPGA, this is of course only one example. In principle, there can be any other divisions. The BRAM structure and also the frames themselves differ with each FPGA family.

The internal configuration interface 2 is controlled via command sequences. With these commands, Block RAM frame contents can be read and written. When accessing a Block RAM frame, the entire frame content must be read or written to the end or to a specific location. The rest of the frame contains the bits for multiplexer configuration, etc. For "Block RAM reading", the data bits are extracted from their known positions from the logic location file during the BRAM frame read. This simple task is performed by the communication controller 2. The following table shows by way of example the read sequence for the internal configuration interface 3 or ICAP interface of a Kintex UltraScale+ for reading n BRAM frame words. The ICAP read sequence for n BRAM frame words listed in the table results in a communication overhead of 177 words. There is no need to create a new frame address for reading consecutive frames, so this overhead is only incurred 1 time.

| Step | Direction | Hex Command | Description |
| --- | --- | --- | --- |
| 1 | Write | 0xFFFFFFFF | Dummy Word |
| 2 | Write | 0x000000BB | Bus Width Sync Word |
| 3 | Write | 0x11220044 | Bus Width Detect |
| 4 | Write | 0xFFFFFFFF | Dummy Word |
| 5 | Write | 0xAA995566 | Sync word |
| 6 | Write | 0x20000000 | NOOP Word 0 |
| 7 | Write | 0x30008001 | Write 1 word to CMD register |
| 8 | Write | 0x00000007 | RCRC Command |
| 9 | Write | 0x20000000 | NOOP Word 0 |
| 10 | Write | 0x20000000 | NOOP Word 0 |
| 11 | Write | 0x20000000 | NOOP Word 0 |
| 12 | Write | 0x20000000 | NOOP Word 0 |
| 13 | Write | 0x20000000 | NOOP Word 0 |
| 14 | Write | 0x20000000 | NOOP Word 0 |
| 15 | Write | 0x30008001 | Write 1 word to CMD register |
| 16 | Write | 0x00000004 | RCFG Command |
| 17 | Write | 0x20000000 | NOOP Word 0 |
| 18 | Write | 0x30002001 | Write 1 word to FAR register |
| 19 | Write | 0xxxxxxxxx | FAR Address = xxxxxxxx |
| 20 | Write | 0x28006000 | Write one word to FDRO register |
| 21 | Write | 0xxxxxxxxx | Read xxx words from FDRO |
| 22 | Write | 0x20000000 | NOOP Word 0 |
| 53 | Write | ... | 31 more NOOP Word 0 |
| 54 | Read | 0xxxxxxxxx | Packet Data Read FDRO Word 0 |
| 171 | Read | ... | |
| 172 | Read | 0xxxxxxxxXX | Packet Data Read FDRO Word 0 xxx |
| 172 + n | Read | ... | |
| 173 + n | Write | 0x20000000 | NOOP Word 0 |
| 174 + n | Write | 0x30008001 | Write 1 word to CMD register |
| 175 + n | Write | 0x0000000D | DESYNC Command |

-continued

| Step | Direction | Hex Command | Description |
|---|---|---|---|
| 176 + n | Write | 0x20000000 | NOOP Word 0 |
| 177 + n | Write | 0x20000000 | NOOP Word 0 |

So that the Block RAMs B1, B2, B3, B4, B5, B6 are not used during an update from the configuration level with inconsistent states, a BUSY signal for the Block RAM B1, B2, B3, B4, B5, B6 is provided in example. This BUSY signal can be realized in different ways. For example, a 1-bit BUSY-signal line can be drawn to each Block RAM B1, B2, B3, B4, B5, B6. This reduces the number of required routes not completely to 0, but to 1. The BUSY-signal line is the technically highest-performing implementation, as it can display the update without latency. It is therefore also preferred for data communication between subregions of the FPGA Block RAM B1, B2, B3, B4, B5, B6.

The use of the first and last Block RAM element can be used as a BUSY signal. For this purpose, the Block RAM size reduced by two must be taken into account in the model. In addition, the address in the model must be automatically incremented by 1. For example, the first word in the Block RAM can start the BUSY signal because it is also written first. The BUSY signal can be set to 1 at (address==0) AND (modification of the Block RAM value). The last word used in the Block RAM can terminate the BUSY signal. The BUSY signal can be set back to 0 at (BUSY signal==1) AND (address==last used).

In order to save the last route, it might be tempting to reconfigure the BUSY signal into a register by partial reconfiguration. Since the frame content of a register must also be modified up to the register position via a read-modify-write combination, while interim state changes in the frame are lost, this mechanism can only be implemented with greater effort (e.g., dedicated frames only for these registers, which would be further away). Nevertheless, it may be provided that the communication controller 2 configures the BUSY signal via the configuration level into a register, wherein this register is placed for this purpose in a CLB frame region that contains no active parts of the FPGA application, so that a read-modify-write sequence of this CLB frame does not falsify runtime values of the FPGA application.

All features explained in connection with individual embodiments or examples of the invention may be provided in different combinations in the subject-matter of the invention in order to simultaneously realize their advantageous effects, even if these have been described with respect to different embodiments.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for data communication between at least one subregion of a field programmable gate array (FPGA) and another subregion of the FPGA, the method comprising:
providing an FPGA unit with the FPGA comprising a communication controller with a cache of the communication controller comprising an internal configuration interface to configure the FPGA and to read back configuration data, the communication controller being set up to provide data communication between subregions of the FPGA, a control of the internal configuration interface being carried out via command sequences, the FPGA further comprising at least one first subregion that is a Block RAM, the Block RAM being addressable via a Block RAM frame, the Block RAM frame including fixed configuration bits and variable data bits, the command sequences of the internal configuration interface Block RAM frame contents being readable and writable, the communication controller being implemented in hardware within the FPGA;
determining, by the communication controller, at least one relative position and at least one fixed value of the configuration bits and at least one relative position of the variable data bits in the Block RAM frame from a reconstruction of a logic location file; and
performing, by the communication controller, a writing of the Block RAM via a read-modify-write sequence that comprises: reading of a current content of a Block RAM frame and storing the contents of the Block RAM frame in the cache of the communication controller via a read sequence, and inserting data bits at their fixed positions known from positions known from the logic location file into the Block RAM frame via a write sequence; or
performing, by the communication controller, the writing of the Block RAM via a template containing the relative positions and fixed values of the configuration bits determined from the reconstruction of the logic location file and the relative positions of the variable data bits in the Block RAM frame, the template being previously stored in the communication controller.

2. The method according to claim 1,
wherein a reading of the Block RAMs is carried out via a Block RAM read sequence, and
wherein the reading of the Block RAMs comprises:
extracting, by the communication controller, data bits from the Block RAM frame via their positions known from the logic location file via the communication controller, the extraction of the data bits being carried out via command sequences of the internal configuration interface.

3. The method according to claim 1, wherein, in the communication controller, different templates for different Block RAM types are stored.

4. The method according to claim 1, wherein, in the template, the relative positions and fixed values of the configuration bits and the relative positions of the variable data bits are stored in a VHDL code for an FPGA build.

5. The method according to claim 1,
wherein the FPGA comprises a transmit Block RAM and a receive Block RAM, and
wherein the method further comprises:
writing data to the transmit Block RAM via the step for writing Block RAM;
triggering the communication controller to copy the data from the transmit Block RAM to the receive Block RAM; and
copying the data from the transmit Block RAM to the receiving Block RAM via the step of reading the Block RAM and the step of writing the Block RAM.

6. The method according to claim 5,
wherein via the internal configuration interface the communication controller takes control of an address port of the transmit Block RAM to be read,
wherein data are substantially simultaneously written from a subregion of the FPGA to an address created by the configuration level of the internal configuration interface in the transmit Block RAM and then read from the configuration level of the internal configuration interface, cached in the communication controller, written by writing data from the communication controller to the receive Block RAM, and wherein the data is substantially simultaneously read from a subregion of the FPGA from the address of the receive Block RAM created by the configuration level of the internal configuration interface.

7. The method according to claim 5, wherein the internal configuration interface writes independently of the subregion address line of the Block RAM to the frame bits of the Block RAM.

8. The method according to claim 5, wherein the data communication between subregions of the FPGA takes place via specially inserted Block RAMs as communication gateways.

9. The method according to claim 1, wherein the communication controller is triggered via a single dedicated control line or by regular polling of the Block RAM data via a transmission flag.

10. The method according to claim 1,
wherein the method for synchronizing the Block RAM accesses comprises a BUSY signal which dedicatedly signals each Block RAM whether the Block RAM is just currently being updated via the internal configuration interface, and
wherein:
the BUSY signal is realized by a 1 bit BUSY-signal line drawn to each Block RAM, or
a first Block RAM element and a last Block RAM element is used for the BUSY signal, or
a first word in the first Block RAM element starts the BUSY signal and a last word used in the last Block RAM element terminates the BUSY signal, and
wherein the communication controller is configured via the configuration level in a register and for this purpose this register is placed in a CLB frame region that contains no active parts of the FPGA application so that a read-modify-write sequence of this CLB frame does not falsify runtime values of the FPGA application.

11. A non-transitory computer readable medium comprising commands which, when executed by a computer, cause the computer to perform a method of a field programmable gate array (FPGA), the FPGA comprising a communication controller with a cache of the communication controller comprising an internal configuration interface to configure the FPGA and to read back configuration data, the communication controller being set up to provide data communication between subregions of the FPGA, a control of the internal configuration interface being carried out via command sequences, the FPGA further comprising at least one first subregion that is a Block RAM, the Block RAM being addressable via a Block RAM frame, the Block RAM frame including fixed configuration bits and variable data bits, the command sequences of the internal configuration interface Block RAM frame contents being readable and writable, the method comprising:
determining at least one relative position and at least one fixed value of the configuration bits and at least one relative position of the variable data bits in the Block RAM frame from a reconstruction of a logic location file; and
performing a writing of the Block RAM via a read-modify-write sequence that comprises: reading of a current content of a Block RAM frame and storing the contents of the Block RAM frame in the cache of the communication controller via a read sequence, and inserting data bits at their fixed positions known from positions known from the logic location file into the Block RAM frame via a write sequence; or
performing the writing of the Block RAM via a template containing the relative positions and fixed values of the configuration bits determined from the reconstruction of the logic location file and the relative positions of the variable data bits in the Block RAM frame, the template being previously stored in the communication controller.

12. A field programmable gate array (FPGA) comprising:
a plurality of subregions including a first subregion and a second subregion;
a plurality of Block RAMs including a first Block RAM and a second Block RAM, the first Block RAM corresponding to the first subregion and the second Block RAM corresponding to the second Block RAM, the first Block RAM acting as a communication gateway for the first subregion and the second Block RAM acting as a communication gateway for the second subregion; and
a communication controller with an internal configuration interface, the communication controller being configured to provide data communication among the plurality of subregions including between the first and second subregions,
wherein the communication controller is configured to provide data communication between subregions of the FPGA, a control of the internal configuration interface being carried out via command sequences, each of the first and second Block RAMs being addressable via a Block RAM frame, the Block RAM frame including fixed configuration bits and variable data bits, the command sequences of the internal configuration interface Block RAM frame contents being readable and writable,
wherein the communication controller is further configured to:
determine at least one relative position and at least one fixed value of the configuration bits and at least one relative position of the variable data bits in the Block RAM frame from a reconstruction of a logic location file; and
perform a writing of the Block RAM via a read-modify-write sequence that comprises: reading of a current content of a Block RAM frame and storing the contents of the Block RAM frame in the cache of the communication controller via a read sequence, and inserting data bits at their fixed positions known from positions known from the logic location file into the Block RAM frame via a write sequence; or
perform the writing of the Block RAM via a template containing the relative positions and fixed values of the configuration bits determined from the reconstruction of the logic location file and the relative positions of the variable data bits in the Block RAM frame, the template being previously stored in the communication controller.

13. The FPGA of claim 12, wherein first and second subregions are freely configurable.

14. The method according to claim 1, wherein communication between the subregions of the FPGA take place via the Block RAMs for the subregions.

* * * * *